United States Patent [19]

Rameil et al.

[11] 4,077,057
[45] Feb. 28, 1978

[54] GAS-INSULATED THYRISTOR ARRANGEMENT COMPRISING A PRESSURE ENCAPSULATION FORMED IN THE MANNER OF A TANK

[75] Inventors: Wilfried Rameil; Manfred Schraudolph; Gerd Thiele, all of Erlangen, Germany

[73] Assignee: Siemens Aktiengesellschaft, Munich, Germany

[21] Appl. No.: 772,673

[22] Filed: Feb. 28, 1977

[30] Foreign Application Priority Data

Mar. 8, 1976   Germany ............................. 2609512

[51] Int. Cl.² ............................................. H05K 7/20
[52] U.S. Cl. ..................................................361/386;
307/252 L; 313/237; 363/141
[58] Field of Search .............. 321/8 C, 27 R; 361/331,
361/389, 381, 382, 385, 386, 388; 357/76;
307/252 L; 174/35 R; 313/237

[56] References Cited

U.S. PATENT DOCUMENTS

| 3,443,142 | 5/1969 | Koppl .................................... 313/237 |
| 3,497,726 | 2/1970 | Rice .................................. 307/252 L |
| 3,943,426 | 3/1976 | Thiele .................................. 321/8 C |

FOREIGN PATENT DOCUMENTS

| 1,563,403 | 4/1970 | Germany. |
| 1,914,790 | 10/1970 | Germany. |
| 2,160,302 | 6/1973 | Germany. |

*Primary Examiner*—Gerald P. Tolin
*Attorney, Agent, or Firm*—Kenyon & Kenyon, Reilly, Carr & Chapin

[57] ABSTRACT

A gas-insulated thyristor arrangement with at least one thyristor column which is constructed of disk-type thyristors and is arranged, together with its associated drive and external-circuit modules, in a rotationally-symmetric shield which is fastened via at least one insulating standoff to the pressure tube of an electrically conductive pressure encapsulation. One end of the pressure tube is closed off by an end plate integrally formed therewith in the manner of a tank and the other end is closed off by means which includes at least one bulkhead of insulating material. The entire arrangement is filled with gaseous SF$_6$ under pressure and detachable electrical connecting leads are extended through the bulkhead.

23 Claims, 3 Drawing Figures

GAS-INSULATED THYRISTOR ARRANGEMENT COMPRISING A PRESSURE ENCAPSULATION FORMED IN THE MANNER OF A TANK

BACKGROUND OF THE INVENTION

1. Field of the Invention

The invention relates to a gas-insulated thyristor arrangement and, in particular, to a gas-insulated thyristor arrangement comprising at least one thyristor column having disk-type thyristors which are stacked side-by-side and are held under spring pressure, heat sinks being arranged between the disk-type thyristors and serving at least partly to also carry current.

Such a thyristor arrangement is disclosed, for example in the German Offenlegungsschrift 1,914,790. The thyristor arrangement is used as a building block or module for the construction of converters, wherein external-circuitry subassemblies are associated with a number of connected thyristor arrangements for protecting the disk-type thyristors against overcurrents and overvoltages, and driving modules are used for transmitting control pulses to the disk-type thristors.

Converters of the aforesaid type are used for rectifying high voltages, for example, the high voltages in high voltage d-c transmission systems (HGUe systems). Particularly where HGUe systems are used in areas of high concentration, it is necessary to keep the overall dimensions of the system as small as possible in order to save space. For operational reasons converters with completely encapsulated valves and grounded encapsulation may be used to accomplish this purpose. In particular, oil-insulated valves, in which the thyristor columns are inserted into an oil-filled tank, can be used. However, for safety reasons, the use of oil, being an inflammable medium, is often precluded. Moreover, for repairs the oil filled tank must be opened, thereby requiring the installation to be taken out of operation for an extended period of time.

In order to meet the safety requirements as well as realize a compact design, a gas-insulated thyristor arrangement has been proposed (Patent Application P 25 30 017.8), which comprises the following: at least one thyristor column having disk-type thyristors which are stacked side-by-side and held under spring pressure; heat sinks which are arranged between the disk-type thyristors and which serve at least partly for carrying current; a rotationally symmetric metal shield surrounding and electrically connected to at least one thyristor column, together with its associated driving modules and at least part of its associated external-circuitry subassemblies; a cylindrical metallic pressure tube which supports the shield via an insulating standoff and which is closed off at both ends by a bulkhead of electrically insulating material and is filled with gaseous $SF_6$ under pressure; and an electrical connecting element extending through each bulkhead in a gas-tight manner.

It has further been proposed (Patent Application P 25 29 954.1) to modify the aforesaid converter arrangement by mechanically detachably connecting the pressure tube thereof at least at one end to a similar pressure tube of another converter arrangement and by detachably connecting the electrical elements of each tube. In this proposed arrangement, valve section chokes and compensating capacitors are also provided in each pressure tube.

It is an object of the present invention to provide a thyristor arrangement or assembly of the aforementioned type which can meet applicable safety requirements as well as be compact in design.

SUMMARY OF THE INVENTION

In accordance with the principles of the present invention, the above and other objectives are met in a thyristor arrangement comprising:

at least one thyristor column, together with its associated driving and the associated external-circuitry modules;

a substantially rotationally symmetrical, electrically conductive shield surrounding and electrically connected to the thyristor column, its associated drive module, and at least a portion of its associated external circuitry modules;

an electrically conductive pressure encapsulation to which the shield is fastened via an electrically insulating standoff, the encapsulation being constructed integrally from a pressure tube which is closed off at one end by an end plate in the manner of a tank;

means comprising at least one bulkhead of electrically insulating material for closing off the other end of the pressure tube in gas-tight manner;

and connecting leads extending through the bulkhead in a gas-tight manner.

With the thyristor arrangement constructed as above-described, a building block or module is obtained from which converters of different design can be constructed in a simple manner. The thyristor arrangement is completely encapsulated and the pressure encapsulation can be grounded. Thereby, danger in the event of an accident is precluded, while the arrangement is very compact, especially since the pressure encapsulation has a favorable geometry for taking up internal pressures. In addition, the diameter of the pressure encapsulation can be matched to the potential of the thyristor arrangement, so that only a small gas volume is required. Also, the length of the sealing surfaces can be held as small as possible, which lowers the manufacturing costs. Moreover, because of the bulkheads, the thyristor arrangement can be installed and removed in a simple manner which requires only the venting of the building block being replaced.

For closing off the pressure tube in a gas-tight manner, a nodal element is preferably provided which comprises an electrically conductive pressure vessel which is detachably mechanically connected to the open end of the pressure tube in a gas-tight manner and which has at least one opening which is closed off by the bulkhead and through which at least one of the connecting leads is brought. Two approximately oppositely aligned openings each closed off by a bulkhead, may also be provided in the pressure vessel. The portions of the electrical connecting leads within the pressure vessel are preferably bent and the bent portions are surrounded by an electrically conductive shield which is connected to the connecting leads in an electrically conducting manner. Advantageously, the shield can have the form of a hollow sphere which surrounds both connecting leads in their bent regions, is supported by one of the connecting leads behind the bend (as seen from the pressure tube) and which has an opening through which extends the other connecting lead. In the interior of the spherical shield, a further electrically conductive shield in the shape of a spherical segment can be arranged here, this latter shield being provided to shield the other connecting lead, being supported by the latter and being connected to it in an electrically conducting manner.

Together with the pressure encapsulation, the nodal element of the combination module forms a closed gas unit. For maintenance work on this unit, only the mechanical connection between the pressure encapsulation and the pressure vessel need be loosened to allow the pressure encapsulation to be lifted from the vessel by means of lifting devices. Separate installation openings are thereby eliminated and the interior of the pressure encapsulation as well as the interior of the nodal element are freely accessible via the respective connecting opening. It is advantageous to arrange in the pressure vessel of the nodal element, a valve section choke for at least one connecting lead and to connect, in addition in the pressure vessel, a compensating capacitor between the two connecting leads. The valve section choke and/or the compensating capacitor are advantageously arranged in the interior of the spherical shield. Thus, these components, which are required for constructing a converter valve of several thyristor arrangements, are integrated into the present thyristor arrangement. It should be emphasized in this connection that the valve section chokes as well as the compensating capacitor are freely accessible for installation and maintenance work via the connecting opening of the nodal element, when the pressure encapsulation is lifted off the vessel.

It is advantageous to realize the oppositely aligned openings of the pressure vessel of the nodal element via tubular sections, each of which is closed off by a bulkhead, and through each of which extends a connecting lead. The tubular sections of several pressure vessels and the connecting leads arranged in the section may be connected to each other to build up a converter valve. In such case, it is advantageous to provide only one bulkhead jointly for two the adjacent tubular sections which are connected together, where the common bulkhead can be realized as a mechanically detachable connection. With this configuration of the invention, it is possible to construct therewith a branch of a converter in a simple manner. In particular, several nodal elements or combination modules are combined into one unit, adjacent nodal elements having joint bulkheads. The interior of such unit remains accessible via the connecting openings of the nodal elements or their pressure vessels, and the installation and maintenance of the valve branch formed thereby remains simple.

It is also advantageous in the present invention to close off the rotationally symmetric shield arranged in the pressure encapsulation with an end plate on one side. In such case, only the end plate of the shield is preferably fastened to the end plate of the pressure encapsulation via the insulating standoff. An arrangement is thus realized, in which the thyristor column is suspended in the pressure encapsulation, or stands upright in a self-supporting manner. The amount of insulation required for the standoff is thereby reduced considerably. In addition, a thyristor arrangement with longer thyristor columns, i.e., with a larger number of disk-type thyristors, can be realized for the suspended position of the thyristor column. This, in turn, provides a cost savings, due to a reduction of the required number of thyristor arrangements.

The pressure encapsulation as well as the pressure vessel of the nodal element can be made of a plastic material whose outside and/or inside surfaces are coated with a metal which serves as an electrically conductive coating, which can be grounded. The aforesaid coated plastic for the pressure vessel and pressure encapsulation can be designed for the required internal pressure of two to three bar and can be produced, for example, inexpensively by a blowing process. Thereby a substantial weight reduction of the arrangement is obtained in addition to a decrease in cost, as the weight of the plastic encapsulation is less than the weight of the corresponding encapsulation of metal. In addition, a pressure encapsulation made of plastic and a pressure vessel made of plastic ensure increased tightness, as in the case of the plastic tube, there are no welded seams, which cannot be avoided in the case of a corresponding metal encapsulation.

In addition, at least one of the shields can also be made of a plastic coated with a metal on its ouside and/or inside surface. The weight and cost of the thyristor arrangement according to the invention are thereby further reduced.

It should be noted that the aforesaid plastic material may be a fiber-glass-reinforced unsaturated polyester resin.

BRIEF DESCRIPTION OF THE DRAWINGS

The above and other features and aspects of the present invention will become more apparent upon reading the following detailed description in conjunction with the accompanying drawings in which.

DETAILED DESCRIPTION

Figure 1:
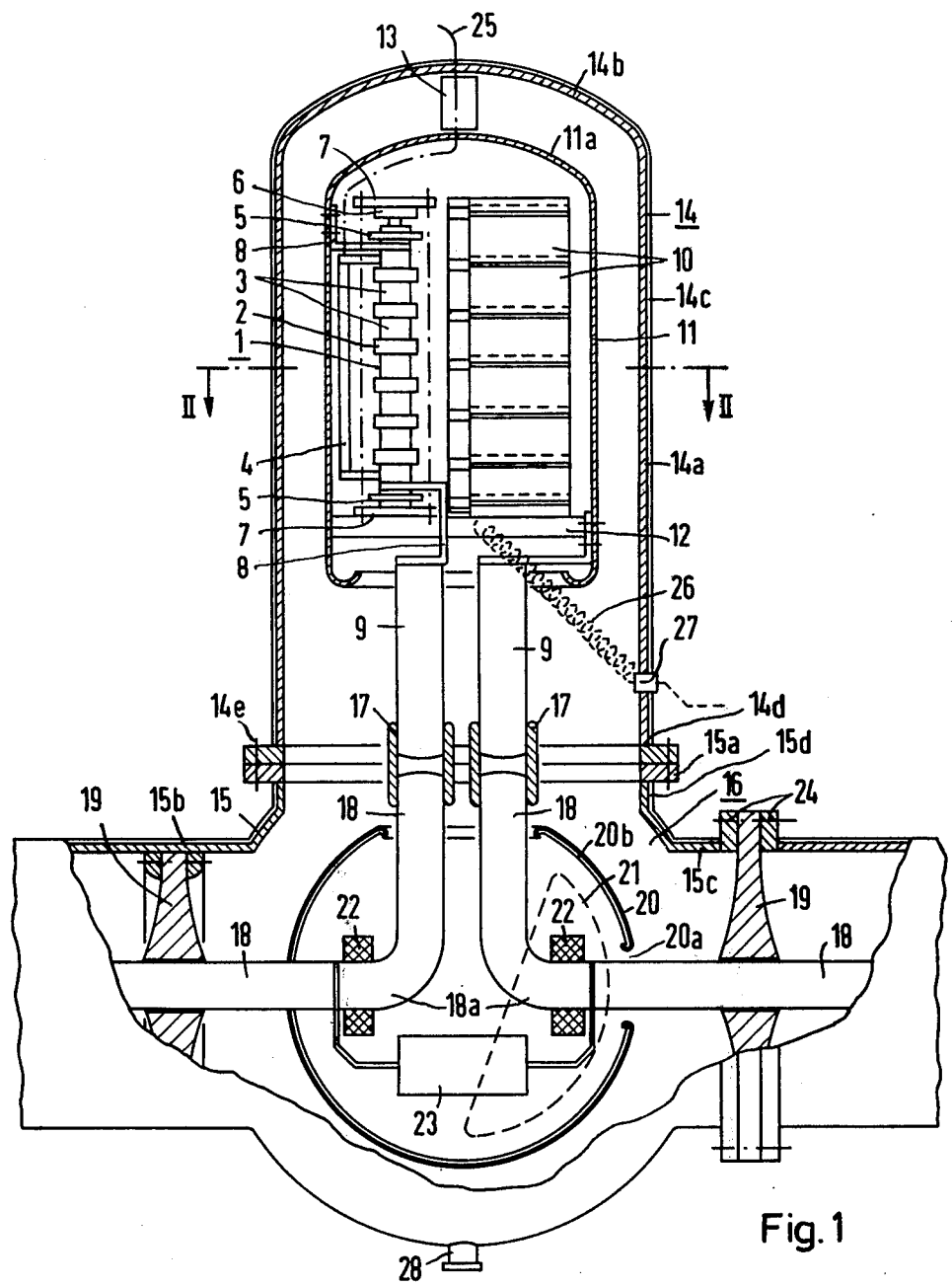
FIG. 1. shows a thyristor arrangement in accordance with the principles of the present invention.

FIG. 1 shows a cross section through a thyristor arrangement in accordance with the principles of the present invention. The thyristor arrangement is equipped with a thyristor column 1, the design of which is described in detail in the above-mentioned German Offenlegungsschrift 1,914,790. The thyristor column 1 includes disk-type thyristors 2 between each pair of which is arranged a heat sink 3 for liquid-cooling the thristors. Heat sinks 3 for performing such liquid-cooling are, described, for example, in the German Offenlegungsschrift 2,160,302. Coolant is fed to the heat sinks 3 via the coolant line 4, as is indicated in FIG. 1. It should be noted that instead of liquid-cooling the thyristors of column 1, gas cooling may also be employed. In such case, gas-cooled heat sinks would be used and $SF_6$ gas could be used as the gaseous coolant.

As shown, the disk-type thyristors 2 are stacked on top of each other in the form of a column and the heat sinks 3 are clamped, via insulators 5 and a pressure element 6, into a frame 7. Regarding the design of the pressure elements 6 and the frame 7, reference is likewise made to the above-mentioned German Offenlegungsschrift 1,914,790. The heat sinks 3 at both ends of the thyristor column 1 are connected via lines 8 to electrical connecting leads 9. Thus, as shown, all the heat sinks 3 serve to carry the electric current and all the disk-type thyristors 2 are connected in series. Associated with the disk-type thyristors 2 are respective driving and external-circuitry subassemblies 10, which in the present embodiment are arranged adjacent the thyristor column 1. The electrical connecting lines between the disktype thyristors 2 and the driving and external-circuitry subassemblies 10 are not shown in FIG. 1 in order to preserve the clarity of the presentation.

The thyristor column 1 and the subassemblies 10 are surrounded by a rotationally-symmetric, electrically conductive shield 11 which, as shown, is a cylindrical member having one side closed off by a domed end plate 11a. This tank-like shield 11 may be made of metal or a plastic material which is coated with a metal on its inside and/or outside surface. Typically an unsaturated polyester resin may be used as the plastic material. In the illustrative case shown, the shield 11 is shown fastened to one of the lines 8 and to one of the lines 9. The metal shield 11 is thus used to carry current, which purpose is also served by a support 12.

The shield 11 is fastened via standoffs 13, which may, for example, be cast-resin, within a electrically conductive pressure encapsulation 14, which is filled with $SF_6$ gas. The pressure encapsulation 14 is in the form of a pressure tube 14a, which is closed off at one end by an integrally formed domed end plate 14b. The pressure encapsulation 14 may be made of a metal, for example, steel, aluminum or copper. In the case shown, the encapsulation 14 is made of an unsaturated polyester resin reinforced, for instance, with fiber glass, and is provided on its outside surface with a metal coating 14c, which can be grounded. With the encapsulation 14 so formed, tightness can be increased and weight saved, while the manufacturing costs are less than those of a corresponding metal encapsulation. Moreover due to the tubular and tank-like design of the encapsulation 14, the encapsulation has a favorable geometry for taking up the internal pressure of the thyristor arrangement and can be laid out with a relatively small wall thickness for a pressure of 2 to 3 bar, which is the pressure at which the insulating $SF_6$ gas must be fed into the thyristor arrangement.

As shown, the end plate 11a of the shield 11 is fastened to the end plate 14b of the pressure encapsulation via only one standoff 13. Additional standoffs 13 can, of course, also be provided, to provide additional bracing of the rotationally-symmetric shield 11 against the tubular portion 14a of the pressure encapsulation 14.

The present illustrative example is particularly suited for a vertical disposition of the pressure encapsulation 14 and for the fastening or suspending of the shield 11 and the thyristor column 1 so that they stand upright. For such fastening or suspending of the shield 11 and the thyristor column 1, a self-supporting design of the components is necessary. As above-noted, in the present case, this is accomplished using the single standoff 13 to suspend the shield 11, the thyristor column 1 and the external-circuitry and driving subassemblies 10. As a result, the amount of solid insulation needed is greatly reduced, thereby resulting in a substantial cost savings. Moreover, with this method of fastening, the length of the thyristor column and, therefore, the number of thyristors which can be included in the column 1 can be increased. This, too, results in cost savings, particularly through a reduction of the number of individual modules which are required for the construction of a converter valve. A further advantage of the arrangement of FIG. 1 is that it permits easier installation and maintenance, as the pressure encapsulation needs to be put in place and mounted only from one direction, which is possible, for example, with a lightlifting gear.

At the open end 14d, the pressure encapsulation 14 is provided with a flange 14e, which is bolted to the flange 15a of the pressure vessel 15 of a nodal element 16. A gas-tight mechanical connection is ensured by placement of gaskets between the ring flanges 14e and 15a. In the region of the ring flanges 14e and 15a, there is further provided a plug connection for coupling the connecting leads 9 to the correcting leads 18 in the nodal element 16 in an electrically conducting manner. As shown, the plug connection is in the form of two contact sleeves 17 which may be fastened either to the connecting leads 18 or to the leads 9. Installation openings, via which the connections between the leads 9 and 18 must be loosened before the pressure encapsulation 14 is lifted off, are, therefore, not necessary in the present invention, thereby permitting a reduction in the lengths of the sealing surfaces.

In the case shown, the pressure vessel 15 of the nodal element 16 has two tubular sections 15b and 15c, which are arranged approximately opposite one another. Each of these sections is closed off in a gas-tight manner by a bulkhead 19 of electrically insulating material, such as, for example, cast resin. One of the connecting leads 18 is brought, in a gas-tight manner, through each of the bulkheads 19. Similarly to the pressure encapsulation 14, the pressure vessel 15 can be made of one of the above mentioned metals or of plastic. In FIG. 1, the pressure vessel 15 is comprised of a plastic having a rounded metal coating 15d on its outside surface. As a result, the pressure vessel, like the pressure encapsulation, results in a weight reduction and greater tightness.

The pressure encapsulation 14 and the pressure vessel 15 of the nodal element 16 form a unified gas space, which is closed off from the outside and is filled with $SF_6$ gas under pressure. This has the advantage of keeping the length of the sealing surfaces in the mechanical joints, e.g., the flanges 143 and 15a, very small. As a result, the sealing problem is simplified and, furthermore, the manufacturing costs are reduced, as flanges are very expensive to manufacture.

Each of the connecting leads 18 has a bend 18a situated in the portion of the lead within the nodal element 16 and each extends from the bend through its respective bulkhead 19. The conductors 18 in the regions of the bends 18a are surrounded by a shield 20 which, as shown, is of substantially spherical shape and is supported on one of the conductors 18 behind the point of the bend 18a therein. The shield 20 also has an opening 20a through which extends the other conductor 18. A second shield 21 in the form of a spherical segment is arranged inside the shield 20 and is connected to and the latter conductor 18. The shield 21 is illustrated in FIG. 1 by dashed lines.

The shields 20 and 21 may be constructed of metal or plastic. As shown, the shield 20 is formed of a plastic having a shielding metal coating 20b on its inside surface. It should be pointed out that the thickness of the metal coating 20b and also the metal coatings 15d and 14c in FIG. 1 have been shown for illustrative purposes as enlarged relative to the wall thickness of the shield 20, the pressure encapsulation 14, and the pressure vessel 15.

As shown, valve section chokes 22 are also disposed inside the spherical shield 20 adjacent each conductor 18. These valve section chokes 22 are necessary for RLC circuitry of a converter valve. In addition, as is also shown, a compensating capacitor 23 is arranged inside the shield 20 between the two connecting leads 18. The capacitor 23 is required for controlling the potential between succeeding sections of a converter valve.

The embodiment of the invention in FIG. 1 thus has the advantage that the valve section chokes 22 as well as the compensating capacitor 23 are integrated into the thyristor arrangement. This reduces the space required for a converter valve and thereby lowers the manufacturing costs. In addition, the valve section chokes 22, as well as the compensating capacitor 23, are freely accessible if the pressure encapsulation 14 is lifted off the pressure vessel 15 of the nodal element 16. It should be pointed out, however, that the valve section chokes 22 as well as the compensating capacitor 23 may be disposed in separate, pressure-encapsulated modules, which can be connected in the assembly of a converter valve between the thyristor arrangements thereof.

In FIG. 1, the tubular sections 15b and 15c, via which the connecting leads 18 are brought out through the bulkheads 19, are connected to the tubular section 15b and 15c, respectively, of an adjacent nodal element. The bulkhead 19 can be common to the two nodal elements, which provides a further cost reduction. In addition, the two tubular sections of adjoining nodal elements can be made in one piece, as the section 15b of FIG. 1, extending to the left, shows, or the bulkhead 19 can be used as a mechanically detachable connection between the tubular sections of adjoining nodal elements, as the section 15c of FIG. 1, extending to the right shows. In the latter case, the bulkhead 19 is bolted between ring flanges 24 of the tubular sections 15c of adjacent nodal elements.

It should further be mentioned that in the encapsulation of the thyristor arrangement of the invention, gas inlet and gas outlet openings, openings for feeding and discharging the coolant, and other openings through which a light guide can be introduced or light can be radiated into encapsulation for supplying control pulses to the driving modules, must be provided. As shown in FIG. 1, a coolant line 25 passing through the standoff 13 provides coolant to the line 4. In addition, a light guide (not shown) can be introduced into the pressure encapsulation 14 via the standoff 13. Likewise, a light guide 26 extends from the driving modules 10 to a glass lens 27 which is inserted gas-tight into the wall of the pressure encapsulation 14. By means of a photo diode (not shown) which may be placed, for example, on the outer wall of the pressure encapsulation 14, control pulses can be fed into the light guide 26. In this embodiment the SF$_6$ gas insulation is also used for separating the potentials in the transmission path for such control pulses. Additionally a valve 28 is provided at the lower end of the spherical part of the pressure vessel 15 and serves as the inlet and outlet.

Figure 2:
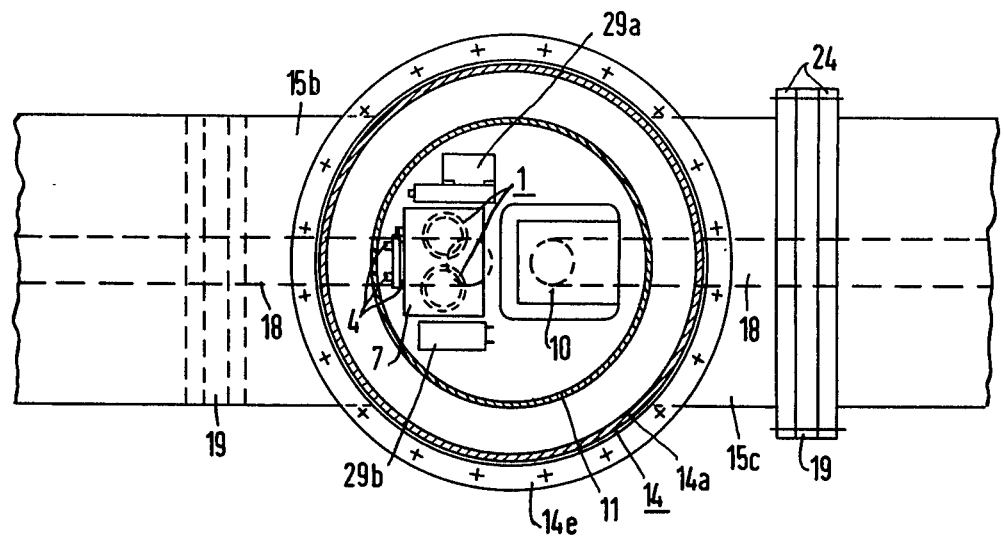
FIG. 2. shows a cross section of the thyristor arrangement of FIG. 1 along the lines II-II.

FIG. 2 shows a cross section along the line II-II of FIG. 1. This figure illustrates the position of the shield 11 and the subassemblies enclosed by it in the pressure encapsulation 14. In addition, it shows that there are actually two thyristor columns 1 arranged in the shield side by side. Inside the shield 11 are further disposed the external-circuitry resistors 29a and the external-circuitry capacitors 29b. The external-circuitry resistors 29a can also be cooled by the coolant provided by line 4 to the thyristor columns. The standoffs, by which the thyristor columns 1 as well as the external-circuit resistors 29a, the external-circuit capacitors 29b and the subassemblies 10 are fastened in the shield 11, are not shown in FIG. 2. Also visible in FIG. 2 are the screw holes in the ring flange 14e, which serve for bolting the pressure encapsulation 14 to the pressure vessal 15 of the nodal element 16.

Figure 3:
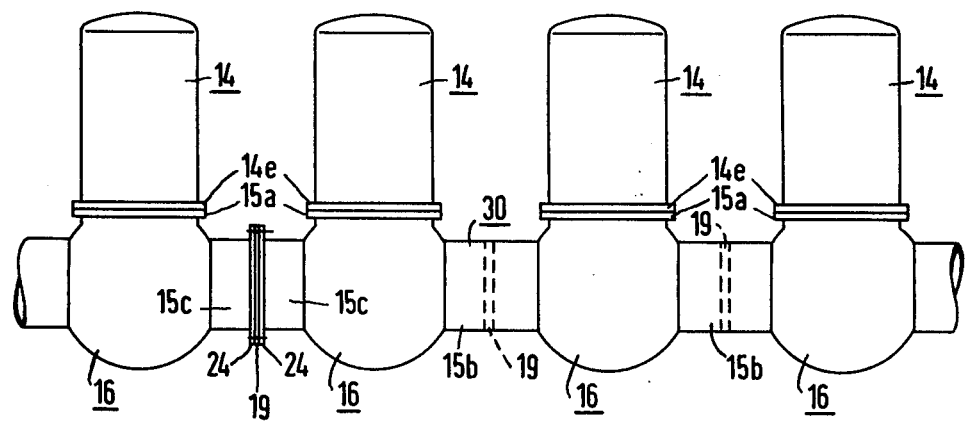
FIG. 3 illustrates a converter valve constructed from a number of the thyristors arrangement shown in FIG. 1.

FIG. 3 shows a portion of a converter valve, in which groups of series-connected thyristor arrangements are arranged side by side. Valves of this type used for air and oil insulation are described for example, in the German Offenlegungsschrift 1,563.403. Such a valve can be used to form a branch of a converter. In FIG. 3, the converter valve portion is built up from several thyristor arrangements as described in FIG. 1 as shown, the tubular sections 15b are made as one piece for several nodal elements 16, so that a combination module 30 is realized for several nodal elements 16. With this combination module 30, the free accessibility of the individual nodal elements 16 is preserved, as a common bulkhead 19 is provided between the nodal elements. This provides economic advantages, as the manufacturing costs are lowered. In addition, this combination module 30 further reduces the length of the sealing surfaces, as the screw connection of adjacent nodal elements at the tubular section 15c via the ring flanges 24 and common bulkheads 19 is always common to several nodal elements 16.

With a thyristor arrangement as in FIG. 1, a converter valve such as is shown in FIG. 3 can thus be build up by the building-block system from a small number of different types of components, all of which can be manufactured by mass production. Thus, different valve designs can be readily realized with the same building blocks, which makes the manufacture of such valves considerably less expensive. In addition, one obtains completely encapsulated grounded valves of small design, which can be used without danger and, as already pointed out repeatedly, are very easy to maintain and repair. The pressure encapsulations 14 with the thyristor columns 1 can be replaced at any time without having to vent the entire installation, and also, replacement of the valve section chokes and the compensating capacitors is easily possible if the pressure encapsulations 14 are taken off.

What is claimed is:

1. Apparatus comprising at least one gas insulated thyristor arrangement said arrangement including:
    at least one thyristor column comprising disc-type thyristors stacked side by side and heat sinks each of which is disposed between an adjacent pair of thyristors and serves to conduct current;
    driving modules and external circuit modules electrically connected to said one thyristor column;
    a substantially rotationally symmetric shielding means, said shielding means being connected in an electrically conductive manner to and surrounding said one column, said driving modules and at least a portion of said external circuit modules;
    an electrically conductive pressure encapsulation including a pressure tube and an end plate closing an end of said tube and integrally formed therewith so as to form a tank;
    an electrically insulating post fastening said shielding means to said pressure encapsulation;
    further means comprising at least one bulkhead formed from an electrically insulating material closing off the other end of said tube in a gas-tight manner;
    and electrical connecting leads extending through said bulkhead for providing electrical connections to said one thyristor column.

2. Apparatus in accordance with claim 1 wherein:
    said further means further includes a nodal element including an electrically conductive pressure vessel which is detachably mechanically connected to said other end of said pressure tube in a gas-tight manner and which has at least one opening which is closed off by said bulkhead and through which at least one of said electrical connecting leads extends.

3. Apparatus in accordance with claim 2 wherein:
said further means includes two bulkheads;
and said vessel has two approximately oppositely aligned openings each being closed off by one of said bulkheads.

4. Apparatus in accordance with claim 3 wherein:
two electrical connecting leads extend through one of said bulkheads into said vessel, the portion of each said electrical connecting lead within said vessel having a bend.

5. Apparatus in accordance with claim 4 further including:
an electrically conductive shielding member surrounding the bend in said electrical connecting leads and connected to one of said connecting leads in an electrically conductive manner.

6. Apparatus in accordance with claim 5 wherein:
said shielding member is spherical, surrounds both connecting leads in the region of their bends, is supported on said one connecting lead beyond the bend in said one connecting lead as viewed from said pressure encapsulation and has an opening through which said other connecting lead extends.

7. Apparatus in accordance with claim 6 further comprising:
a further conducting shielding member in the form of a spherical segment which shields is supported on and is connected in an electrically conducting manner to said other connecting lead.

8. Apparatus in accordance with claim 6 further including:
a valve section choke arranged in said vessel for at least one of said electrical connecting leads.

9. Apparatus in accordance with claim 6 further including:
a compensating capacitor arranged in said vessel and connected between said electrical connecting leads.

10. Apparatus in accordance with claim 8 wherein:
said choke is arranged within said spherical shielding member.

11. Apparatus in accordance with claim 9 wherein:
said compensating capacitor is arranged within said spherical shielding member.

12. Apparatus in accordance with claim 2 wherein:
said vessel includes: first and second tubular sections each of which has an open end forming an opening in said vessel
and said further means includes two bulkheads each of which closes off the end of one of said tubular sections and through each of which one of said connecting leads extends.

13. Apparatus in accordance with claim 12 including a plurality of said thyristor arrangements and wherein adjacent tubular sections of said arrangements are connected together and the connecting leads within said adjacent sections are connected together.

14. Apparatus in accordance with claim 13 wherein adjacent connected tubular sections of adjacent thyristor arrangements have a common bulkhead closing off their respective adjacent open ends.

15. Apparatus in accordance with claim 14 wherein:
each common bulkhead connecting tubular sections of adjacent thyristor arrangements is a detachably mechanical connection arranged between those adjacent tubular sections.

16. Apparatus in accordance with claim 2 further including plug connections for said connecting leads, said connections being arranged in the region of the connection of said vessel to said other end of said pressure tube.

17. Apparatus in accordance with claim 1 wherein said rotationally symmetric shielding means includes an end plate.

18. Apparatus in accordance with claim 17 wherein:
said post is fastened to said end plates of said pressure tube and said rotationally symmetric shielding means.

19. Apparatus in accordance with claim 1 wherein:
said pressure tube is formed of a plastic material having a metallic coating on one of its outer and inner surfaces.

20. Apparatus in accordance with claim 2 wherein:
said vessel is formed from a plastic material having a metallic coating on one of its outer and inner surfaces.

21. Apparatus in accordance with claim 7 wherein:
at least one of said rotationally symmetric shielding means, said shielding member and said further shielding member is formed from a plastic material having metallic coating on one of its outer and inner surfaces.

22. Apparatus in accordance with claim 21 wherein:
said plastic material is a fiberglass reinforced, unsaturated polyester resin.

23. Apparatus in accordance with claim 1 further including:
a gaseous medium comprising $SF_6$ gas under pressure filling said pressure encapsulation.

* * * * *